US008934086B2

(12) United States Patent
Shigematsu

(10) Patent No.: US 8,934,086 B2
(45) Date of Patent: Jan. 13, 2015

(54) ILLUMINATION OPTICAL SYSTEM, EXPOSURE APPARATUS AND DEVICE MANUFACTURING METHOD

(75) Inventor: Koji Shigematsu, Kawasaki (JP)

(73) Assignee: Nikon Corporation, Tokyo (JP)

(*) Notice: Subject to any disclaimer, the term of this patent is extended or adjusted under 35 U.S.C. 154(b) by 443 days.

(21) Appl. No.: 13/161,877

(22) Filed: Jun. 16, 2011

(65) Prior Publication Data
US 2011/0310375 A1 Dec. 22, 2011

(30) Foreign Application Priority Data

Jun. 19, 2010 (JP) ................ P2010-140024

(51) Int. Cl.
*G03B 27/72* (2006.01)
*G03F 7/20* (2006.01)

(52) U.S. Cl.
CPC ........ *G03F 7/70566* (2013.01); *G03F 7/70108* (2013.01)
USPC .............................................. 355/71; 355/67

(58) Field of Classification Search
CPC ............ G03F 7/70191; G03F 7/70058; G03F 7/70091; G03F 7/70566
USPC ................................ 355/53, 67, 71
See application file for complete search history.

(56) References Cited

U.S. PATENT DOCUMENTS

| | | | |
|---|---|---|---|
| 6,900,915 B2 | 5/2005 | Nanjyo et al. | |
| 6,913,373 B2 | 7/2005 | Tanaka et al. | |
| 6,952,253 B2 | 10/2005 | Lof et al. | |
| 7,095,546 B2 | 8/2006 | Mala et al. | |
| 2005/0206871 A1* | 9/2005 | Tsuji | 355/71 |
| 2006/0170901 A1* | 8/2006 | Tanitsu et al. | 355/71 |
| 2007/0146676 A1* | 6/2007 | Tanitsu et al. | 355/71 |
| 2007/0296936 A1 | 12/2007 | Kato et al. | |

(Continued)

FOREIGN PATENT DOCUMENTS

EP 0 779 530 A1 6/1997
EP 1 420 298 A2 5/2004

(Continued)

OTHER PUBLICATIONS

Tsuruta, K. et al., "Transmission of Light in Crystals (2) Optical Rotation and Dichroism," *Applied Optics II*, 1990, pp. 166-167 (with translation).

*Primary Examiner* — Steven H Whitesell Gordon
(74) *Attorney, Agent, or Firm* — Oliff PLC

(57) ABSTRACT

According to an embodiment, the illumination optical system for illuminating an illumination target surface with light from a light source is provided with a polarization converting member which converts a polarization state of incident light so as to form a pupil intensity distribution in a predetermined polarization state on an illumination pupil of the illumination optical system; and a phase modulating member which is arranged in the optical path on the illumination target surface side with respect to the polarization converting member and which transmits light from the pupil intensity distribution so as to convert linearly polarized light thereof polarized in a first direction, into required elliptically polarized light and maintain a polarization state of linearly polarized light polarized in a second direction (X-direction or Y-direction) obliquely intersecting with the first direction, in order to reduce influence of retardation caused by a subsequent optical system between the polarization converting member and the illumination target surface.

32 Claims, 16 Drawing Sheets

(56) References Cited

U.S. PATENT DOCUMENTS

| | | | |
|---|---|---|---|
| 2008/0123055 A1* | 5/2008 | Mori et al. | 353/20 |
| 2008/0273185 A1* | 11/2008 | Omura et al. | 355/67 |
| 2009/0027646 A1* | 1/2009 | Fiolka et al. | 355/67 |
| 2009/0035671 A1* | 2/2009 | Shinoda | 430/30 |
| 2009/0073411 A1* | 3/2009 | Tanitsu | 355/67 |
| 2009/0091730 A1 | 4/2009 | Tanaka | |
| 2009/0097007 A1 | 4/2009 | Tanaka | |
| 2009/0097094 A1 | 4/2009 | Tanaka | |
| 2009/0109417 A1 | 4/2009 | Tanitsu | |
| 2009/0116093 A1 | 5/2009 | Tanitsu | |
| 2009/0128886 A1 | 5/2009 | Hirota | |
| 2009/0185154 A1 | 7/2009 | Tanitsu | |
| 2009/0284729 A1* | 11/2009 | Shiraishi | 355/71 |

FOREIGN PATENT DOCUMENTS

| | | |
|---|---|---|
| EP | 1 720 047 A1 | 11/2006 |
| JP | A-6-124873 | 5/1994 |
| JP | A-10-303114 | 11/1998 |
| JP | A-2002-353105 | 12/2002 |
| JP | A-2004-304135 | 10/2004 |
| JP | A-2006-113437 | 4/2006 |
| JP | A-2007-48996 | 2/2007 |
| WO | WO99/49504 A1 | 9/1999 |
| WO | WO 2004/055803 A1 | 7/2004 |
| WO | WO 2005/076045 A1 | 8/2005 |
| WO | WO 2005-124420 A1 | 12/2005 |
| WO | WO 2006/016469 A1 | 2/2006 |
| WO | WO 2006/077849 A1 | 7/2006 |

* cited by examiner

ILLUMINATION OPTICAL SYSTEM, EXPOSURE APPARATUS AND DEVICE MANUFACTURING METHOD

BACKGROUND

1. Field

An embodiment of the invention relates to an illumination optical system, an exposure apparatus, and a device manufacturing method. More particularly, the embodiment relates to an illumination optical system suitably applicable to an exposure apparatus for manufacturing devices, for example, such as semiconductor devices, imaging devices, liquid crystal display devices, and thin film magnetic heads by the lithography process.

2. Description of the Related Art

In the typical exposure apparatus of this type, light emitted from a light source travels through a fly's eye lens as an optical integrator to form a secondary light source as a substantial surface illuminant consisting of a large number of light sources (generally, a predetermined light intensity distribution on an illumination pupil). The light intensity distribution on the illumination pupil will be referred to hereinafter as "pupil intensity distribution." The illumination pupil is defined as a position where an illumination target surface becomes a Fourier transform plane of the illumination pupil by action of an optical system between the illumination pupil and the illumination target surface (a mask or a wafer in the case of the exposure apparatus).

Light from the secondary light source is condensed by a condenser optical system and thereafter illuminates the mask with a predetermined pattern thereon in a superimposed manner. Light passing through the mask travels through a projection optical system to be focused on the wafer, whereby the mask pattern is projected and exposed (or transferred) onto the wafer. The pattern formed on the mask is highly microscopic and, in order to accurately transfer this microscopic pattern onto the wafer, it is essential to obtain a uniform illuminance distribution on the wafer.

In recent years, for realizing an illumination condition suitable for faithful transfer of the microscopic pattern in any direction, there is the proposed technology of forming the annular secondary light source (annular pupil intensity distribution) on the illumination pupil at or near the rear focal plane of the fly's eye lens and setting the beam passing through the annular secondary light source, in a linearly polarized state having the direction of polarization along a circumferential direction thereof (hereinafter referred to simply as "circumferentially polarized state") (e.g., cf. International Publication WO2005/076045)

SUMMARY

According to an embodiment, an illumination optical system for illuminating an illumination target surface with light from a light source, comprising:

a polarization converting member which can be arranged in an optical path of the illumination optical system and which converts a polarization state of incident light so as to form a pupil intensity distribution in a predetermined polarization state on an illumination pupil of the illumination optical system; and a phase modulating member which can be arranged in the optical path of the illumination optical system and which transmits light from the pupil intensity distribution so as to convert linearly polarized light thereof polarized in a first direction, into required elliptically polarized light and maintain a polarization state of linearly polarized light thereof polarized in a second direction obliquely intersecting with the first direction, in order to reduce influence of retardation caused by a subsequent optical system between the polarization converting member and the illumination target surface.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

Figure 1:
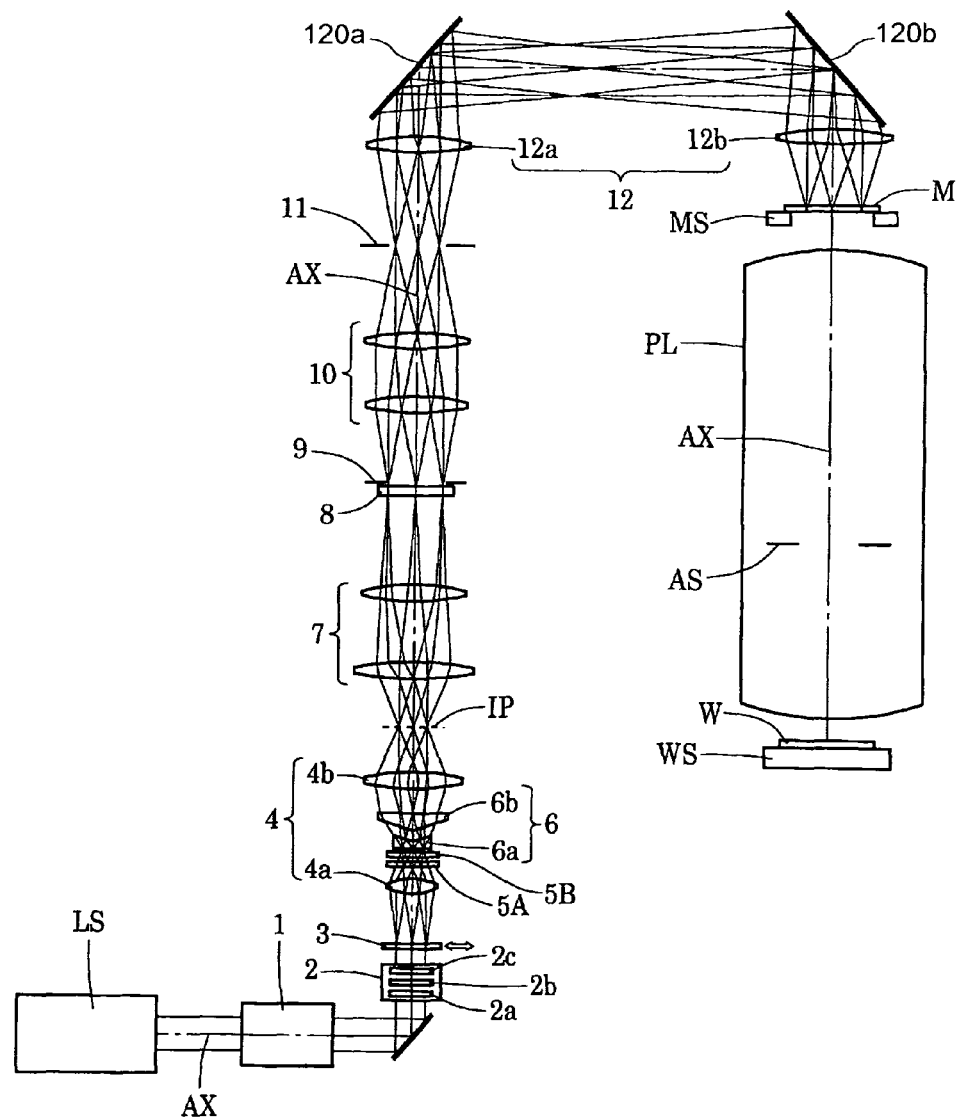
FIG. 1 is an exemplary drawing schematically showing a configuration of an exposure apparatus according to an embodiment of the present invention.

Various embodiments will be described on the basis of the accompanying drawings. FIG. 1 is an exemplary drawing schematically showing a configuration of an exposure apparatus according to an embodiment of the present invention. In FIG. 1, the Z-axis is set along a direction of a normal to an exposure surface (transfer surface) of a wafer W being a photosensitive substrate, the Y-axis along a direction parallel to the plane of FIG. 1 in the exposure surface of the wafer W, and the X-axis along a direction perpendicular to the plane of FIG. 1 in the exposure surface of the wafer W.

With reference to FIG. 1, exposure light (illumination light) is supplied from a light source LS in the exposure apparatus of the present embodiment. The light source LS applicable herein can be, for example, an ArF excimer laser light source to supply light at the wavelength of 193 nm or a KrF excimer laser light source to supply light at the wavelength of 248 nm. A beam emitted from the light source LS travels via a shaping optical system 1, a polarization state switching unit 2, and a diffraction optical element 3 to enter an afocal lens 4. The shaping optical system 1 has a function to convert the nearly parallel beam from the light source LS into a beam having a predetermined rectangular cross section and to guide the resultant beam to the polarization state switching unit 2.

The polarization state switching unit 2 is provided with, in order from the light source side, a quarter wave plate 2a which is configured with its crystal optic axis being rotatable around the optical axis AX and which converts elliptically polarized light incident thereinto, into linearly polarized light, a half wave plate 2b which is configured with its crystal optic axis being rotatable around the optical axis AX and which changes a direction of polarization of linearly polarized light incident thereinto, and a depolarizer (depolarizing element) 2c which can be inserted into or retracted from an illumination optical path. The polarization state switching unit 2 functions as follows: in a state in which the depolarizer 2c is retracted from the illumination optical path, the polarization state switching unit 2 converts the light from the light source LS into linearly polarized light having a desired polarization direction and injects the resultant light into the diffraction optical element 3; in a state in which the depolarizer 2c is set in the illumination optical path, the polarization state switching unit 2 converts the light from the light source LS into substantially unpolarized light and injects the unpolarized light into the diffraction optical element 3.

The afocal lens 4 is an afocal system (afocal optic) which is so set that its front focal position approximately coincides with the position of the diffraction optical element 3 and that its rear focal position approximately coincides with a position of a predetermined plane IP indicated by a dashed line in the drawing. The diffraction optical element 3 is constructed by forming blocks having the pitch nearly equal to the wavelength of the exposure light (illumination light), in a substrate, and has an action to diffract an incident beam at desired angles. It is assumed hereinafter for easier description that the diffraction optical element 3 is one for annular illumination.

Figure 2:
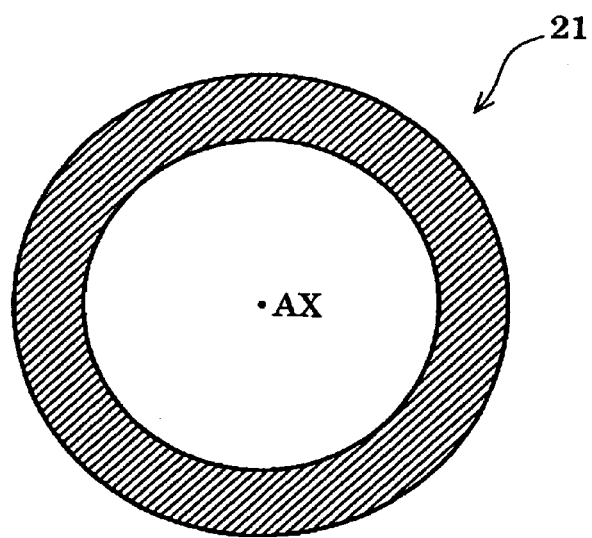
FIG. 2 is an exemplary drawing showing a state in which an annular light intensity distribution is formed on a pupil plane of an afocal lens.
Figure 2:
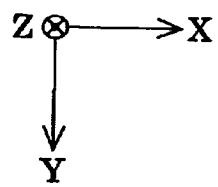

The diffraction optical element 3 for annular illumination functions in such a manner that when a parallel beam with a rectangular cross section is incident thereinto, it forms an annular light intensity distribution in the far field (or Fraunhofer diffraction region). Therefore, the nearly parallel beam incident into the diffraction optical element 3 forms an annular light intensity distribution 21 on a pupil plane of the afocal lens 4, as shown in FIG. 2, and is then emitted in an annular angle distribution from the afocal lens 4. There are a polarization converting member 5A, a phase modulating member 5B, and a conical axicon system 6 arranged at or near the pupil position of the afocal lens 4 in the optical path between front lens unit 4a and rear lens unit 4b of the afocal lens 4. The configurations and actions of the polarization converting member 5A, phase modulating member 5B, and conical axicon system 6 will be described later.

The light passing through the afocal lens 4 travels through a zoom lens 7 for varying the σ value (σvalue=mask-side numerical aperture of the illumination optical system/mask-side numerical aperture of the projection optical system), to enter a micro fly's eye lens (or fly's eye lens) 8 as an optical integrator. The micro fly's eye lens 8 is, for example, an optical element consisting of a large number of microscopic lenses with a positive refracting power arranged lengthwise and crosswise and densely, and is constructed by forming the microscopic lens group in a plane-parallel plate by etching.

Each microscopic lens forming the micro fly's eye lens is smaller than each lens element forming the fly's eye lens. In the micro fly's eye lens, different from the fly's eye lens consisting of lens elements isolated from each other, the large number of microscopic lenses (microscopic refracting faces) are integrally formed without being isolated from each other. However, the micro fly's eye lens is an optical integrator of the same wavefront division type as the fly's eye lens in that the lens elements with the positive refracting power are arranged lengthwise and crosswise. It is also possible to use, for example, a cylindrical micro fly's eye lens as the micro fly's eye lens 8. The configuration and action of the cylindrical micro fly's eye lens are disclosed, for example, in U.S. Pat. No. 6,913,373.

The position of the predetermined plane IP is arranged at or near the front focal position of the zoom lens 7 and an entrance surface of the micro fly's eye lens 8 is arranged at or near the rear focal position of the zoom lens 7. In other words, the zoom lens 7 arranges the predetermined plane IP and the entrance surface of the micro fly's eye lens 8 substantially in a Fourier transform relation and, in turn, arranges the pupil plane of the afocal lens 4 and the entrance surface of the micro fly's eye lens 8 substantially optically conjugate with each other.

Therefore, for example, an annular illumination field centered on the optical axis AX is formed on the entrance surface of the micro fly's eye lens 8 as on the pupil plane of the afocal lens 4. The overall shape of this annular illumination field varies in a similarity relation depending upon the focal length of the zoom lens 7. The beam incident into the micro fly's eye lens 8 is divided two-dimensionally to form a secondary light source with a light intensity distribution substantially identical to the illumination field formed on the entrance surface of the micro fly's eye lens 8, i.e., a secondary light source (pupil intensity distribution) consisting of a substantial surface illuminant of an annular shape centered on the optical axis AX, at a rear focal plane of the micro fly's eye lens 8 or at a position near it.

An illumination aperture stop 9 having an annular aperture (light transmitting portion) corresponding to the annular secondary light source is arranged, if necessary, at or near the rear focal plane of the micro fly's eye lens 8. The illumination aperture stop 9 is configured so as to be freely inserted into or retracted from the illumination optical path and so as to be interchangeable with a plurality of aperture stops having apertures of different sizes and shapes. An aperture stop switching method applicable herein can be, for example, the well-known turret method or slide method. The illumination aperture stop 9 is arranged at a position substantially optically conjugate with an entrance pupil plane of projection optical system PL and defines a range of contribution of the secondary light source to illumination.

The light having traveled through the micro fly's eye lens 8 and the illumination aperture stop 9 travels through a condenser optical system 10 to illuminate a mask blind 11 in a superimposed manner. In this way, a rectangular illumination field according to the shape and focal length of the microscopic lenses of the micro fly's eye lens 8 is formed on the mask blind 11 as an illumination field stop. The light having traveled through a rectangular aperture (light transmitting portion) of the mask blind 11 travels via an imaging optical system 12 consisting of a front lens unit 12a and a rear lens unit 12b, to illuminate a mask M on which a predetermined pattern is formed, in a superimposed manner.

Namely, the imaging optical system 12 forms an image of the rectangular aperture of the mask blind 11 on the mask M. A pupil of the imaging optical system 12 is another illumination pupil located at a position optically conjugate with the illumination pupil at or near the rear focal plane of the micro fly's eye lens 8. Therefore, an annular pupil intensity distribution is also formed at the position of the pupil of the imaging optical system 12 as at the illumination pupil just behind the micro fly's eye lens 8.

The pattern to be transferred is formed on the mask M held on a mask stage MS. The light passing through the pattern of the mask M travels through the projection optical system PL to form an image of the mask pattern on the wafer (photosensitive substrate) W held on a wafer stage WS. In this way, the pattern of the mask M is sequentially exposed in each exposure region on the wafer W by full-shot exposure or by scan exposure with two-dimensional drive and control of the wafer W in a plane (XY plane) perpendicular to the optical axis AX of the projection optical system PL. In performing the scan exposure, the mask stage MS and the wafer stage WS are driven at a speed ratio according to a magnification of the projection optical system PL, for example, along the Y-direction.

The conical axicon system 6 is composed of, in order from the light source side, a first prism member 6a with a plane on the light source side and a refracting surface of a concave conical shape on the mask side, and a second prism member 6b with a plane on the mask side and a refracting surface of a convex conical shape on the light source side. The refracting surface of the concave conical shape of the first prism member 6a and the refracting surface of the convex conical shape of the second prism member 6b are formed in such a complementary relation as to be able to abut each other. At least one of the first prism member 6a and the second prism member 6b is configured to be movable along the optical axis AX so that the spacing between the first prism member 6a and the second prism member 6b can vary.

In a state in which the first prism member 6a and the second prism member 6b abut each other, the conical axicon system 6 functions as a plane-parallel plate to cause no effect on the annular secondary light source formed. However, as the first prism member 6a and the second prism member 6b are separated away from each other, the outside diameter (inside diameter) of the annular secondary light source varies while the width of the annular secondary light source (half of the difference between the outside diameter and the inside diameter of the annular secondary light source) is kept constant. Namely, the annular ratio (inside diameter/outside diameter) and the size of the annular secondary light source (outside diameter) vary.

The zoom lens 7 functions to enlarge or reduce the overall shape of the annular secondary light source in a similarity relation. For example, when the focal length of the zoom lens 7 is increased from a minimum to a predetermined value, the overall shape of the annular secondary light source is increased in a similarity relation. In other words, the width and size (outside diameter) of the secondary light source both vary without change in the annular ratio of the annular secondary light source, by the action of the zoom lens 7. In this manner, the annular ratio and size (outside diameter) of the annular secondary light source can be controlled by the actions of the conical axicon system 6 and the zoom lens 7.

In the present embodiment, as described above, the mask M arranged on the illumination target surface of the illumination optical system (1-12) is illuminated by Köhler illumination using the secondary light source formed by the micro fly's eye lens 8, as a light source. For this reason, the position where the secondary light source is formed is optically conjugate with the position of the aperture stop AS of the projection optical system PL and the plane where the secondary light source is formed can be called an illumination pupil plane of the illumination optical system (1-12). Typically, the illumination target surface (the surface where the mask M is arranged, or the surface where the wafer W is arranged if the illumination optical system is considered to include the projection optical system PL) is an optical Fourier transform plane with respect to the illumination pupil plane.

A pupil intensity distribution is a light intensity distribution (luminance distribution) on the illumination pupil plane of the illumination optical system (1-12) or on a plane optically conjugate with the illumination pupil plane. When the number of wavefront divisions by the micro fly's eye lens 8 is relatively large, the global light intensity distribution formed on the entrance plane of the micro fly's eye lens 8 demonstrates a high correlation with the global light intensity distribution (pupil intensity distribution) of the entire secondary light source. For this reason, the light intensity distributions on the entrance plane of the micro fly's eye lens 8 and on a plane optically conjugate with the entrance place (e.g., the pupil plane of the afocal lens 4) can also be called pupil intensity distributions. Namely, the pupil of the afocal lens 4 which is a plane optically conjugate with the entrance plane of the micro fly's eye lens 8 can also be called an illumination pupil.

If a diffraction optical element for multi-polar illumination (dipolar illumination, quadrupolar illumination, octupolar illumination, or the like) (not shown) is set instead of the diffraction optical element 3 for annular illumination in the illumination optical path, multi-polar illumination can be implemented. The diffraction optical element for multi-polar illumination functions in such a manner that when a parallel beam with a rectangular cross section is incident thereinto, it forms a light intensity distribution of a multi-polar shape (dipolar, quadrupolar, octupolar, or other shape) in the far field. Therefore, beams having traveled via the diffraction optical element for multi-polar illumination form an illumination field of a multi-polar shape, for example, consisting of a plurality of illumination zones of a predetermined shape (arcuate, circular, or other shape) centered on the optical axis AX on the entrance plane of the micro fly's eye lens 8. As a result, the secondary light source of the same multi-polar shape as the illumination field formed on the entrance plane of the micro fly's eye lens 8 is also formed at or near the rear focal plane of the micro fly's eye lens 8.

If a diffraction optical element for circular illumination (not shown) is set instead of the diffraction optical element 3 for annular illumination in the illumination optical path, ordinary circular illumination can be implemented. The diffraction optical element for circular illumination functions in such a manner that when a parallel beam with a rectangular cross section is incident thereinto, it forms a light intensity distribution of a circular shape in the far field. Therefore, a beam having traveled via the diffraction optical element for circular illumination forms, for example, an illumination field of a circular shape centered on the optical axis AX on the entrance plane of the micro fly's eye lens 8. As a result, the secondary light source of the same circular shape as the illumination field formed on the entrance plane is also formed at or near the rear focal plane of the micro fly's eye lens 8. If a diffraction optical element with an appropriate property (not shown) is set instead of the diffraction optical element 3 for annular illumination in the illumination optical path, modified illumination of any one of various forms can be implemented. A switching method of the diffraction optical element 3 applicable herein can be, for example, the well-known turret method or slide method.

Instead of the above-described diffraction optical element 3 or in addition to the diffraction optical element 3, it is also possible to apply, for example, a spatial light modulator in which orientations of a plurality of mirror elements arranged two-dimensionally are varied continuously or discretely each in a plurality of stages. The spatial light modulator of this type applicable herein can be, for example, one of the spatial light modulators disclosed in European Patent Application Laid-Open No. 779530, U.S. Pat. No. 6,900,915, U.S. Pat. No. 7,095,546, and Japanese Patent Application Laid-Open No. 2006-113437. The illumination optical system using such an active spatial light modulator is disclosed, for example, in U.S. Patent Application Laid-Open No. 2009/0073411, U.S. Patent Application Laid-Open No. 2009/0091730, U.S. Patent Application Laid-Open No. 2009/0109417, U.S. Patent Application Laid-Open No. 2009/0128886, U.S. Patent Application Laid-Open No. 2009/0097094, U.S. Patent Application Laid-Open No. 2009/0097007, U.S. Patent Application Laid-Open No. 2009/0185154, and U.S. Patent Application Laid-Open No. 2009/0116093. The disclosures of above European Patent Application Laid-Open No. 779530, U.S. Pat. No. 6,900,915, U.S. Pat. No. 7,095,546, Japanese Patent Application Laid-Open No. 2006-113437, U.S. Patent Application Laid-Open No. 2009/0073411, U.S. Patent Application Laid-Open No. 2009/0091730, U.S. Patent Application Laid-Open No. 2009/0109417, U.S. Patent Application Laid-Open No. 2009/0128886, U.S. Patent Application Laid-Open No. 2009/0097094, U.S. Patent Application Laid-Open No. 2009/0097007, U.S. Patent Application Laid-Open No. 2009/0185154, and U.S. Patent Application Laid-Open No. 2009/0116093 are incorporated herein by reference.

Figure 3:
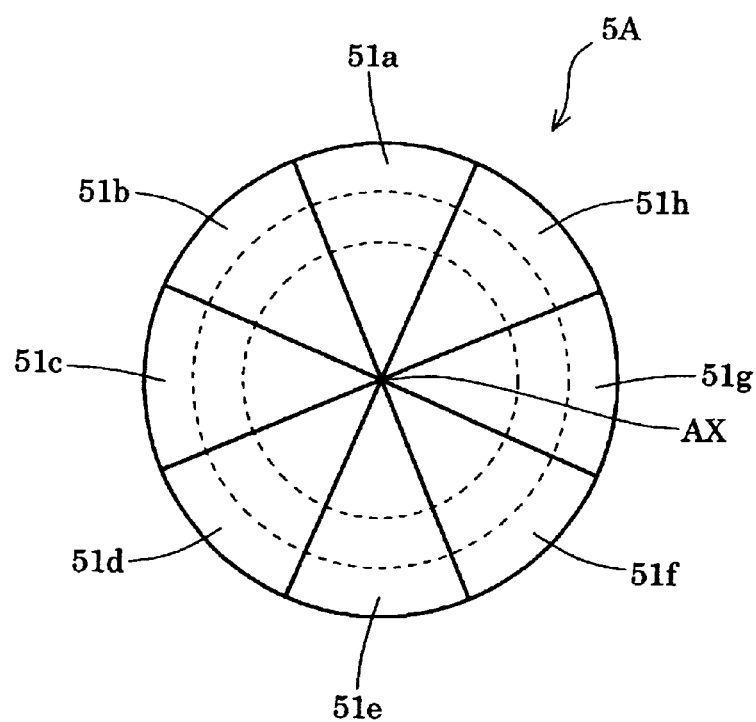
FIG. 3 is an exemplary drawing schematically showing a configuration of a polarization converting member according to the embodiment of the present invention.
Figure 3:
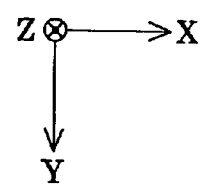

FIG. 3 is an exemplary drawing schematically showing the configuration of the polarization converting member. The polarization converting member 5A is arranged at or near the pupil position of the afocal lens 4, i.e., at or near the position of the illumination pupil of the illumination optical system (1-12), as described above. It is assumed hereinafter for easier understanding of description that the polarization converting member 5A is arranged at a position just in front of the illumination pupil in the optical path of the afocal lens 4. When the diffraction optical element 3 for annular illumination is arranged in the illumination optical path, a beam having an annular cross section is incident into the polarization converting member 5A.

The polarization converting member 5A has a form of a plane-parallel plate in whole and is made of a crystal material being an optical material having an optical rotatory power, e.g., rock crystal. In a state in which the polarization converting member 5A is positioned in the optical path, an entrance surface thereof (and, therefore, an exit surface) is perpendicular to the optical axis AX and the crystal optic axis thereof is coincident with the direction of the optical axis AX (i.e., coincident with the Z-direction being the traveling direction of incident light). The polarization converting member 5A has a contour of a circular shape (or a circular ring shape which is not shown) centered on the optical axis AX, as shown in FIG. 3, and has eight divided regions resulting from equal division of the circular contour into eight equal segments along the circumferential direction of the circle.

Specifically, the polarization converting member 5A has, as the eight divided regions, regions 51a, 51b, 51c, 51d, 51e, 51f, 51g, and 51h. The divided regions 51a-51h are regions that are separated so that eight arcuate beams obtained by equal division of the incident annular beam (indicated by two dashed circles in FIG. 3) into eight equal parts along the circumferential direction, pass through the respective regions. Among the divided regions 51a-51h, any two divided regions adjacent in the circumferential direction have respective thicknesses (lengths along the direction of the optical axis AX) different from each other and any two divided regions opposed to each other on both sides of the optical axis AX have respective thicknesses identical with each other.

The polarization converting member 5A is a single member formed integrally by an etching process of one surface (entrance surface or exit surface) of a plane-parallel plate of rock crystal. Namely, one surface of the polarization converting member 5A is formed in an uneven shape with eight linear blocks extending radially from the center thereof, and the other surface is formed in a planar shape. Alternatively, the polarization converting member 5A is composed of a combination of eight optical rotatory members corresponding to the divided regions 51a-51h.

Figure 4:
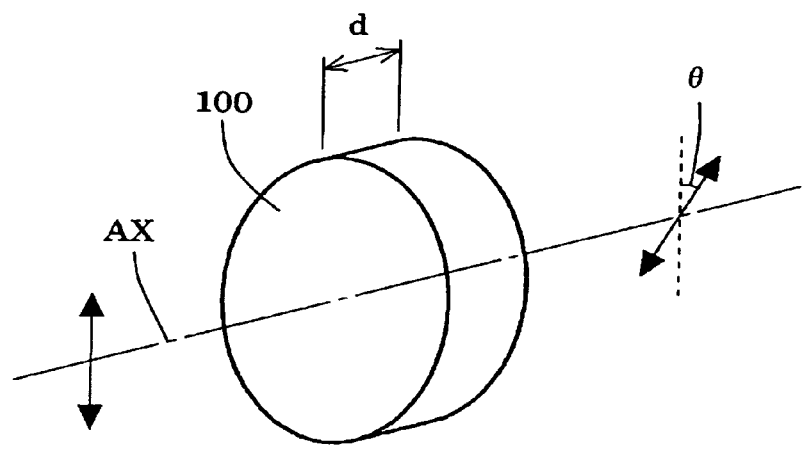
FIG. 4 is an exemplary drawing for explaining the optical rotatory power of rock crystal.

The optical rotatory power of rock crystal will be briefly described below with reference to FIG. 4. With reference to FIG. 4, an optical member 100 of a plane-parallel plate shape made of rock crystal and in thickness d is arranged so that its crystal optic axis coincides with the optical axis AX. In this case, owing to the optical rotatory power of the optical member 100, the direction of polarization of linearly polarized light incident thereinto is rotated by θ around the optical axis AX and the linearly polarized light thus rotated is emitted.

At this time, the rotation angle (optical rotatory angle) θ of the polarization direction owing to the optical rotatory power of the optical member 100 is represented by formula (a) below using the thickness d of the optical member 100 and the optical rotatory power ρ of rock crystal. In general, the optical rotatory power ρ of rock crystal has wavelength dependence (a property of optical rotatory power varying depending upon the wavelength of light used: optical rotatory dispersion) and, specifically, tends to increase with decrease of the wavelength of the used light. According to the description in Tadao Tsuruta, "Ouyou Kogaku (Applied Optics) II," p 167, BAIFU-KAN CO., LTD. (1990), the optical rotatory power ρ of rock crystal is 153.9°/mm for light with the wavelength of 250.3 nm.

$$\theta = d \cdot \rho \qquad (a)$$

Referring again to FIG. 3, the divided region 51a of the polarization converting member 5A is arranged so that its center line (straight line extending radially from the optical axis AX) coincides with a straight line extending in the −Y-direction through the optical axis AX. The divided region 51a has the thickness set so that when Y-directionally linearly polarized light having the polarization direction along the Y-direction is incident thereinto, it emits linearly polarized light having the polarization direction along a direction resulting from +90° (90° counterclockwise in FIG. 3) rotation of the Y-direction. The divided region 51b adjacent to the divided region 51a along the counterclockwise circumferential direction in FIG. 3 has the thickness set so that when Y-directionally linearly polarized light is incident thereinto, it emits linearly polarized light having the polarization direction along a direction resulting from +135° rotation of the Y-direction.

The divided region 51c adjacent to the divided region 51b has the thickness set so that when Y-directionally linearly polarized light is incident thereinto, it emits linearly polarized light having the polarization direction along a direction resulting from +180° rotation of the Y-direction. The divided region 51d adjacent to the divided region 51c has the thickness set so that when Y-directionally linearly polarized light is incident thereinto, it emits linearly polarized light having the polarization direction along a direction resulting from +225° rotation of the Y-direction. The divided region 51e adjacent to the divided region 51d and opposed to the divided region 51a with the optical axis AX in between has the thickness set so that when Y-directionally linearly polarized light is incident thereinto, it emits linearly polarized light having the polarization direction along a direction resulting from +90° rotation of the Y-direction, as the divided region 51a does.

The divided region 51f opposed to the divided region 51b has the thickness set so that when Y-directionally linearly polarized light is incident thereinto, it emits linearly polarized light having the polarization direction along a direction resulting from +135° rotation of the Y-direction. The divided region 51g opposed to the divided region 51c has the thickness set so that when Y-directionally linearly polarized light is incident thereinto, it emits linearly polarized light having the polarization direction along a direction resulting from +180° rotation of the Y-direction. The divided region 51h opposed to the divided region 51d has the thickness set so that when Y-directionally linearly polarized light is incident thereinto, it emits linearly polarized light having the polarization direction along a direction resulting from +225° rotation of the Y-direction.

The action of the polarization converting member 5A will be described on the assumption that Y-directionally linearly polarized light is incident into the polarization converting member 5A, with reference to FIG. 5. An arcuate beam F1 incident into the divided region 51a of the polarization converting member 5A turns into X-directionally linearly polarized light (laterally polarized light) having the polarization direction along the direction resulting from +90° (90° counterclockwise in FIG. 5) rotation of the Y-direction, i.e., along the X-direction. A beam F2 generated through the divided region 51b turns into obliquely linearly polarized light (obliquely polarized light) having the polarization direction along the oblique direction resulting from +135° rotation of the Y-direction.

A beam F3 generated through the divided region 51c turns into Y-directionally linearly polarized light (vertically polarized light) having the polarization direction along the direction resulting from +180° rotation of the Y-direction, i.e., along the Y-direction. Similarly, a beam F4 generated through the divided region 51d turns into obliquely linearly polarized light having the polarization direction along the oblique direction resulting from +225° rotation of the Y-direction. A beam F5 generated through the divided region 51e turns into X-directionally linearly polarized light as the beam F1 opposed thereto with the optical axis AX in between does.

A beam F6 generated through the divided region 51f turns into obliquely linearly polarized light having the polarization direction along the oblique direction resulting from +135° rotation of the Y-direction, as the beam F2 opposed thereto with the optical axis AX in between does. A beam F7 generated through the divided region 51g turns into Y-directionally linearly polarized light as the beam F3 opposed thereto with the optical axis AX in between does. A beam F8 generated through the divided region 51h turns into obliquely linearly polarized light having the polarization direction along the oblique direction resulting from +225° rotation of the Y-direction as the beam F4 opposed thereto with the optical axis AX in between does.

In this manner, the annular light intensity distribution 21 is formed in a circumferentially polarized state of the eight equal division type on the illumination pupil just behind the polarization converting member 5A. In the circumferentially polarized state, a beam passing through the annular light intensity distribution 21 is in a linearly polarized state with the polarization direction along a tangent direction to a circle centered on the optical axis AX. As a result, if influence of retardation described below can be ignored, an annular light intensity distribution will be formed in an almost continuous, circumferentially polarized state corresponding to the annular light intensity distribution 21, on the illumination pupil just behind the micro fly's eye lens 8. Furthermore, an annular light intensity distribution is also formed in an almost continuous, circumferentially polarized state corresponding to the annular light intensity distribution 21, at the positions of the other illumination pupils optically conjugate with the illumination pupil just behind the micro fly's eye lens 8, i.e., at the pupil position of the imaging optical system 12 and the pupil position of the projection optical system PL (the position where the aperture stop AS is arranged).

In general, in the case of circumferential polarization illumination based on the pupil intensity distribution of the annular shape or the multi-polar shape (dipolar, quadrupolar, octupolar, or other shape) in the circumferentially polarized state, the light impinging upon the wafer W as a final illumination target surface is in a polarization state with a principal component of s-polarized light. The s-polarized light herein is linearly polarized light having the polarization direction along a direction perpendicular to the plane of incidence (polarized light with the electric vector vibrating in directions perpendicular to the plane of incidence). The plane of incidence is defined as follows: when light arrives at a boundary surface of a medium (illumination target surface: the surface of the wafer W), a plane including a normal to the boundary surface at that point and a direction of incidence of the light is defined as plane of incidence. As a consequence, the circumferential polarization illumination improves the optical performance (the depth of focus and others) of the projection optical system and allows the mask pattern image to be formed with high contrast on the wafer (photosensitive substrate).

Figure 5:
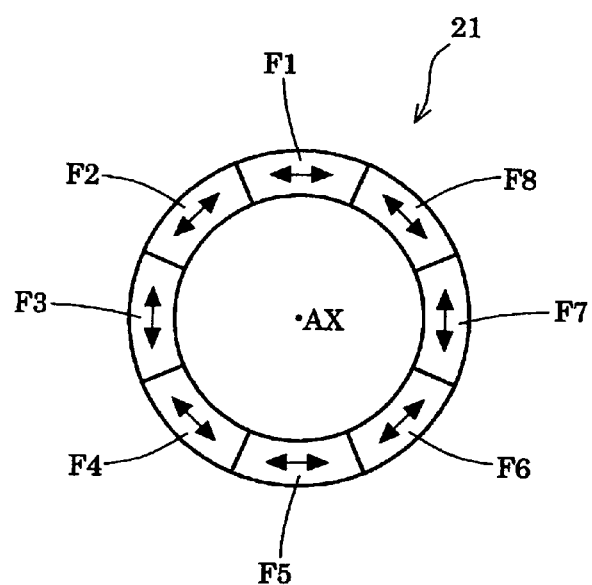
FIG. 5 is an exemplary drawing showing an annular light intensity distribution in an almost continuous, circumferentially polarized state formed on an illumination pupil just behind the polarization converting member.
Figure 5:
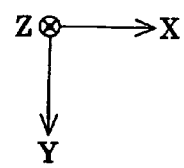

In the present embodiment, the desired circumferentially polarized state as shown in FIG. 5 is generated on the illumination pupil just behind the polarization converting member 5A. However, if the illumination optical system is configured without the phase modulating member 5B in the present embodiment, the light will not be focused in the required circumferentially polarized state on the wafer W because of influence of retardation (a phenomenon of occurrence of a phase difference between a pair of linear polarization components with their polarization directions perpendicular to each other) caused by the subsequent optical system (optical system arranged between the polarization converting member 5A and the wafer W) arranged in the optical path downstream the polarization converting member 5A, and, in turn, it will become difficult to form the pattern image of the mask M with required contrast on the wafer W.

Figure 6:
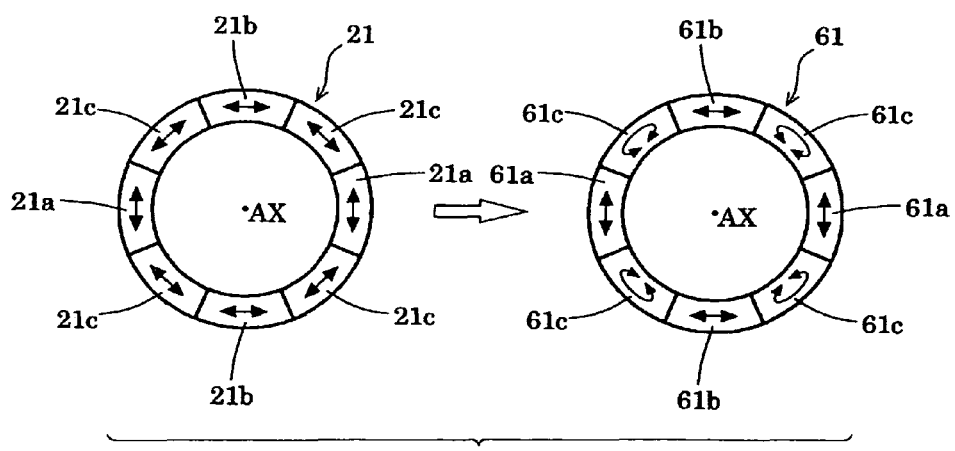
FIG. 6 is an exemplary drawing for explaining the problem of the conventional technology about the light intensity distribution of FIG. 5.

Referring to FIG. 1, the subsequent optical system (5B-PL) is provided with a pair of plane reflecting mirrors 120a, 120b for bending of optical path (path bending mirrors having their respective planar reflecting surfaces) in the optical path of the imaging optical system 12. A certain type of projection optical system PL is provided with a plane reflecting mirror in the optical path between the object plane (plane where the pattern surface of the mask M is arranged) and the aperture stop AS. If the illumination optical system is not provided with the phase modulating member 5B, even if the pupil intensity distribution 21 is generated in the desired circumferentially polarized state on the illumination pupil just behind the polarization converting member 5A, as shown in FIG. 6, a pupil intensity distribution 61 will be generated in a partially disordered polarization state from the desired circumferentially polarized state, at the pupil position (the position of the illumination pupil: the position where the aperture stop AS is arranged) in the optical path of the projection optical system PL because of the influence of the retardation caused by these plane reflecting mirrors.

Specifically, in the pupil intensity distribution 21, beams 21a, 21b of vertically polarized light and laterally polarized light having the polarization directions along the directions corresponding to the polarization direction of p-polarized light or the polarization direction of s-polarized light relative to the reflecting surfaces of the plane reflecting mirrors are rarely affected by the retardation by the plane reflecting mirrors and turn into beams 61a, 61b of vertically polarized light and laterally polarized light in the pupil intensity distribution 61. However, beams 21c of obliquely polarized light having the polarization directions along directions obliquely intersecting with the directions corresponding to the polarization direction of p-polarized light or the polarization direction of s-polarized light are affected by the retardation by the plane reflecting mirrors and turn into beams 61c of elliptically polarized light (which is a general concept including circularly polarized light) in the pupil intensity distribution 61.

Figure 7:
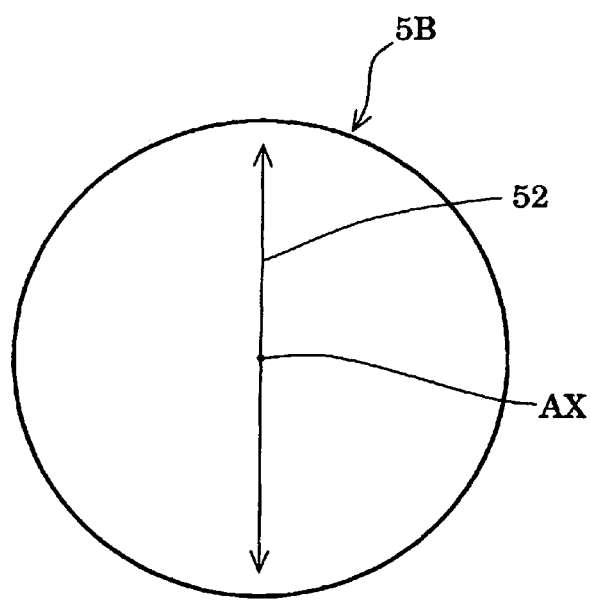
FIG. 7 is an exemplary drawing schematically showing a configuration of a phase modulating member according to the embodiment.
Figure 7:
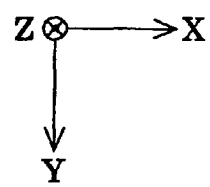

In the present embodiment, the phase modulating member 5B is provided just behind the polarization converting member 5A, in order to make the polarization state of the pupil intensity distribution formed on the illumination pupil in the optical path of the projection optical system PL, closer to the desired circumferentially polarized state against the retardation caused by the subsequent optical system. The phase modulating member 5B is a wave plate extending across the entire cross section of the illumination optical path and having uniform thickness, as shown in FIG. 7, and its optic axis 52 is set in the Y-direction (or X-direction). In other words, the optic axis 52 of the wave plate forming the phase modulating member 5B is set in the direction corresponding to the polarization direction of p-polarized light or the polarization direction of s-polarized light relative to the reflecting surfaces of the plane reflecting mirrors in the subsequent optical system.

Figure 8:
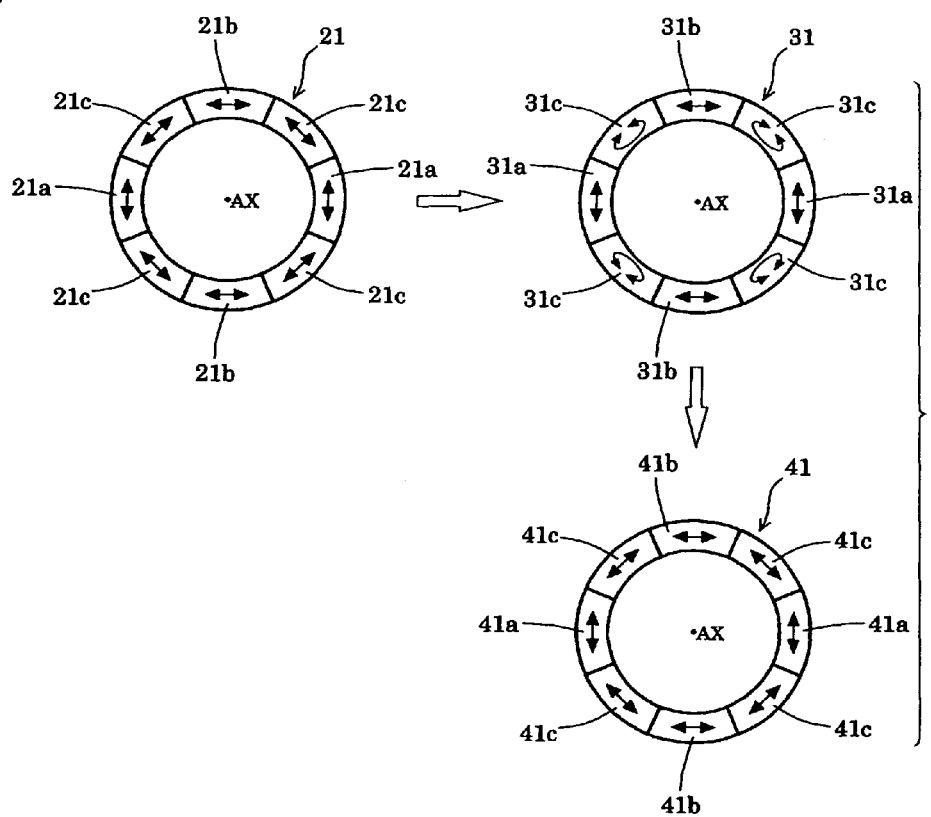
FIG. 8 is an exemplary drawing for explaining the action of the phase modulating member in the embodiment.

In this case, as shown in FIG. 8, the beams 21a, 21b of vertically polarized light and laterally polarized light in the pupil intensity distribution 21 just behind the polarization converting member 5A are rarely subjected to phase modulation by the phase modulating member 5B and turn into beams 31a, 31b of vertically polarized light and laterally polarized light in a light intensity distribution 31 formed just behind the phase modulating member 5B. On the other hand, beams 21c of obliquely polarized light are subjected to phase modulation by the phase modulating member 5B and turn into beams 31c of elliptically polarized light in the light intensity distribution 31. The degree of polarization of the beams 31c of elliptically polarized light is dependent upon the thickness of the wave plate forming the phase modulating member 5B.

FIG. 1 shows the example in which the subsequent optical system has the two planar reflecting surfaces (corresponding to the reflecting surfaces of the plane reflecting mirrors 120a, 120b for bending of optical path), but the subsequent optical system may have only one planar reflecting surface. For example, in a case where a reflecting surface is composed of a plane reflecting mirror as in the example of FIG. 1, a single reflecting mirror for bending of optical path can be provided in the optical path of the imaging optical system 12. The optic axis of the wave plate forming the phase modulating member 5B is set in a direction along a first plane including the optical axis of the optical system arranged on the light source side of the reflecting mirror for bending of optical path and the optical axis of the optical system arranged on the illumination target surface side of the reflecting mirror for bending of optical path, or in a direction perpendicular to the direction along the first plane. In this case, the wave plate forming the phase modulating member transmits the light from the pupil intensity distribution so as to convert linearly polarized light thereof polarized in a first direction, into required elliptically polarized light and maintain the polarization state of linearly polarized light polarized in a second direction obliquely intersecting with the first direction. The second direction corresponds to the polarization direction of p-polarized light or the polarization direction of s-polarized light relative to the reflecting surface.

The subsequent optical system may have a plurality of planar reflecting surfaces (two, three, four, or more reflecting surfaces). Namely, where the reflecting surfaces are composed of plane reflecting mirrors, a configuration obtained by providing the foregoing configuration wherein the single reflecting mirror for bending of optical path is provided in the optical path of the imaging optical system 12, with another reflecting mirror for bending of optical path, corresponds to the example shown in FIG. 1. In this case, a second plane including the optical axis of the optical system arranged on the light source side of the other reflecting mirror for bending of optical path and the optical axis of the optical system arranged on the illumination target surface side of the other reflecting mirror for bending of optical path is coincident with the first plane or parallel to the first plane. Furthermore, in the cases where the subsequent optical system has a plurality of reflecting surfaces, the second direction also corresponds to the polarization direction of p-polarized light or the polarization direction of s-polarized light relative to each of the reflecting surfaces.

In the light intensity distribution 31 just behind the phase modulating member 5B, the beams 31a, 31b of vertically polarized light and laterally polarized light are rarely affected by the retardation by the subsequent optical system (among others, the retardation by the planar reflecting surfaces provided in the optical path of the subsequent optical system) and turn into beams 41a, 41b of vertically polarized light and laterally polarized light in a pupil intensity distribution 41 formed on the illumination pupil in the optical path of the projection optical system PL. Furthermore, the beams 31c of elliptically polarized light in the light intensity distribution 31 are affected by the retardation by the subsequent optical system and turn into beams 41c of almost required obliquely polarized light in the pupil intensity distribution 41.

In the present embodiment, the polarization converting member 5A converts the polarization state of incident light to form the pupil intensity distribution 21 in the circumferentially polarized state on the illumination pupil just behind it. The phase modulating member 5B composed of the wave plate arranged just behind the polarization converting member 5A transmits the light from the pupil intensity distribution 21 so as to convert the beams 21c of obliquely polarized light polarized in oblique directions (directions intersecting at 45° with the X-direction and the Y-direction), into the beams 31c of required elliptically polarized light and maintain the polarization states of the beams 21a, 21b of vertically polarized light and laterally polarized light polarized in the Y-direction and X-direction.

The degree of polarization of the beams 31c subjected to the phase modulation from obliquely polarized light into elliptically polarized light by the phase modulating member 5B (and, therefore, the thickness of the wave plate forming the phase modulating member 5B) is set in such a manner that the beams 31c of elliptically polarized light turn into the beams 41c of almost required obliquely polarized light in the pupil intensity distribution 41, after affected by the retardation by the subsequent optical system. As a result, the influence of retardation is reduced by the phase modulation action of the phase modulating member 5B, whereby the pupil intensity distribution 41 is generated in the almost desired, circumferentially polarized state on the illumination pupil in the optical path of the projection optical system PL.

As described above, the illumination optical system (1-12) of the present embodiment reduces the influence of the retardation caused by the subsequent optical system behind the polarization converting member 5A and is able to illuminate the pattern surface of the mask M as an illumination target surface with the light in the required circumferentially polarized state. Furthermore, the exposure apparatus (1-WS) of the present embodiment is able to image the pattern of the mask M with required contrast on the wafer W, using the illumination optical system (1-12) which illuminates the pattern of the mask M with the light in the required circumferentially polarized state.

Figure 9:
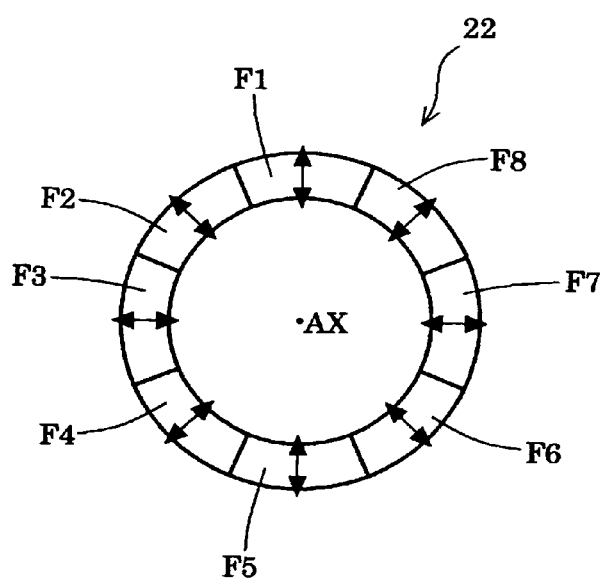
FIG. 9 is an exemplary drawing showing an annular light intensity distribution in an almost continuous, radially polarized state formed on the illumination pupil just behind the polarization converting member.
Figure 9:
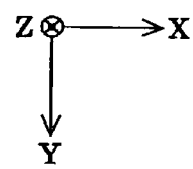
Figure 10:
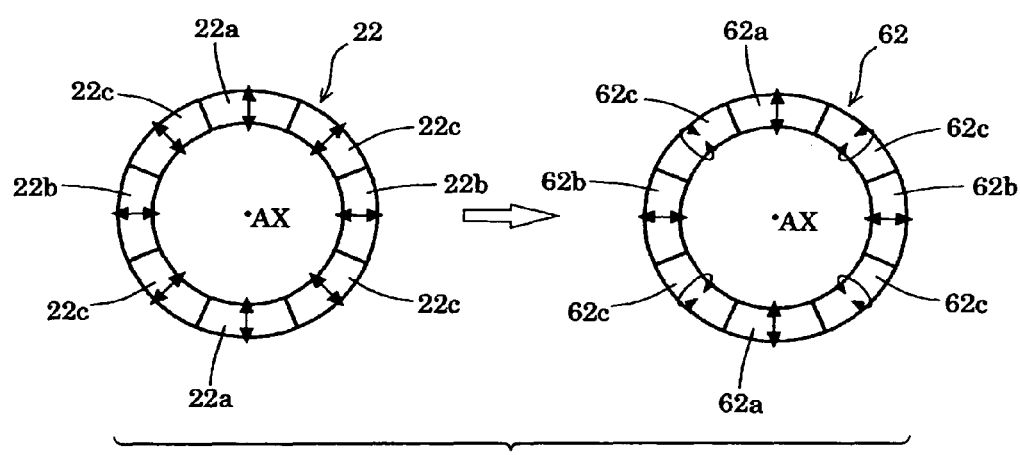
FIG. 10 is an exemplary drawing for explaining the problem of the conventional technology about the light intensity distribution of FIG. 9.

The above description concerned the incidence of the Y-directionally linearly polarized light into the polarization converting member 5A, but if X-directionally linearly polarized light is incident thereinto, an annular light intensity distribution 22 is formed in a substantially continuous, radially polarized state of the eight equal division type, as shown in FIG. 9, on the illumination pupil just behind the polarization converting member 5A. As a result, if the influence of retardation can be ignored, the annular light intensity distribution will also be formed in the substantially continuous, radially polarized state corresponding to the annular light intensity distribution 22, on the illumination pupil just behind the micro fly's eye lens 8, at the pupil position of the imaging optical system 12, and at the pupil position of the projection optical system PL.

In general, in the case of the radial polarization illumination based on the pupil intensity distribution of the annular shape or the multi-polar shape in the radially polarized state, the light impinging upon the wafer W as a final illumination target surface is in a polarization state with a principal component of p-polarized light. The p-polarized light herein is linearly polarized light having the polarization direction along a direction parallel to the plane of incidence defined as described above (or polarized light with the electric vector vibrating in directions parallel to the plane of incidence). As a result, the radial polarization illumination reduces the reflectance of light on a resist applied onto the wafer W, and allows a good mask pattern image to be formed on the wafer W.

It is, however, often the case in practice that the influence of retardation caused by the subsequent optical system cannot be ignored. In that case, where the illumination optical system is configured without the phase modulating member 5B, beams 22c of obliquely polarized light in the pupil intensity distribution 22 are affected by the retardation and turn into beams 62c of elliptically polarized light in a pupil intensity distribution 62 formed on the illumination pupil in the optical path of the projection optical system PL. Beams 22a, 22b of vertically polarized light and laterally polarized light are rarely affected by the retardation and turn into beams 61a, 61b of vertically polarized light and laterally polarized light in the pupil intensity distribution 62.

In the present embodiment, in the case of the radial polarization illumination, the beams 22a, 22b of vertically polarized light and laterally polarized light in the pupil intensity distribution 22 just behind the polarization converting member 5A are rarely affected by the phase modulation by the phase modulating member 5B and the retardation by the subsequent optical system and turn into the beams of vertically polarized light and laterally polarized light in the pupil intensity distribution formed on the illumination pupil in the optical path of the projection optical system PL. On the other hand, the beams 22c of obliquely polarized light are subject to the phase modulation by the phase modulating member 5B and turn into elliptically polarized light, and thereafter the elliptically polarized beams are affected by the retardation by the subsequent optical system and return into the almost required obliquely polarized beams. As a result, the influence of retardation is reduced by the phase modulation action of the phase modulating member 5B and the pupil intensity distribution is generated in the almost desired, radially polarized state on the illumination pupil in the optical path of the projection optical system PL.

The above description explained the operational effect of the present embodiment, using the modified illumination in which the annular pupil intensity distribution is formed on the illumination pupil, i.e., the annular illumination as an example. It is, however, clear that, without having to be limited to the annular illumination, the present embodiment can be similarly applied, for example, to the multi-polar illumination in which a multi-polar pupil intensity distribution is formed, and other illumination to achieve the same operational effect.

Figure 11:
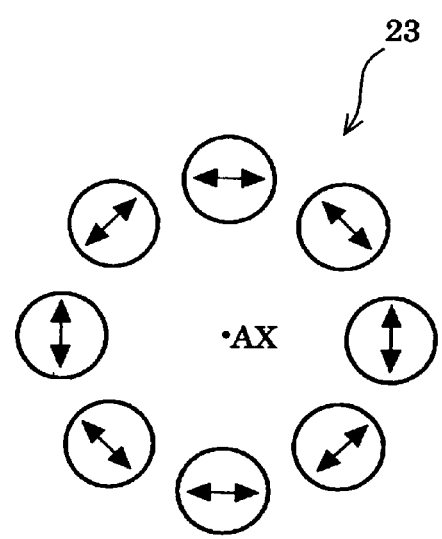
FIG. 11 is an exemplary drawing showing an octupolar light intensity distribution in a circumferentially polarized state formed on the illumination pupil just behind the polarization converting member.
Figure 11:
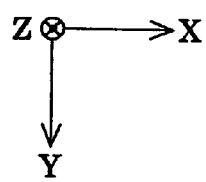
Figure 12:
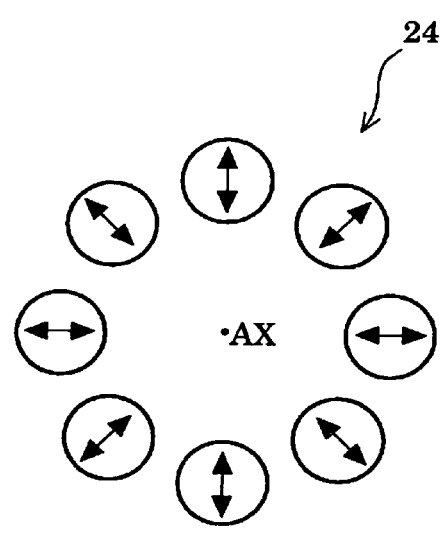
FIG. 12 is an exemplary drawing showing an octupolar light intensity distribution in a radially polarized state formed on the illumination pupil just behind the polarization converting member.
Figure 12:
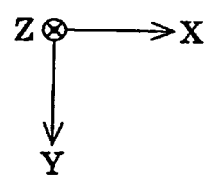

As an example, as shown in FIG. 11, where an octupolar light intensity distribution 23 is formed in a circumferentially polarized state on the illumination pupil just behind the polarization converting member 5A through the use of a diffraction optical element for octupolar illumination, an octupolar pupil intensity distribution can also be generated in an almost desired, circumferentially polarized state on the illumination pupil in the optical path of the projection optical system PL by the phase modulation action of the phase modulating member 5B. In a case where an octupolar light intensity distribution 24 is formed in a radially polarized state on the illumination pupil just behind the polarization converting member 5A as shown in FIG. 12, an octupolar pupil intensity distribution can also be generated in an almost desired, radially polarized state on the illumination pupil in the optical path of the projection optical system PL by the phase modulation action of the phase modulating member 5B.

Incidentally, the annular or octupolar pupil intensity distribution 21-24 includes the mixture of the beams 21a-24a; 21b-24b of vertically polarized light and laterally polarized light with the beams 21c-24c of obliquely polarized light. Therefore, the beams 21a-24a; 21b-24b of vertically polarized light and laterally polarized light are kept as vertically polarized light and laterally polarized light rarely affected by the phase modulation by the phase modulating member 5B and the beams 21c-24c of obliquely polarized light turn into the elliptically polarized light as subjected to the phase modulation by the phase modulating member 5B.

Figure 13:
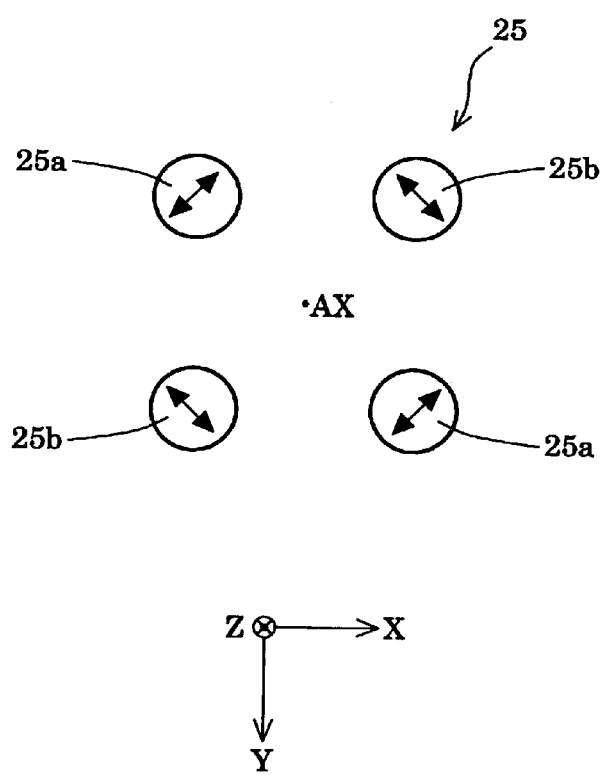
FIG. 13 is an exemplary drawing showing an X-shaped quadrupolar light intensity distribution in a circumferentially polarized state formed on the illumination pupil just behind the polarization converting member.

In contrast to it, in a case where an X-shaped quadrupolar light intensity distribution 25 is formed in a circumferentially polarized state on the illumination pupil just behind the polarization converting member 5A through the use of a diffraction optical element for quadrupolar illumination as shown in FIG. 13, there are only beams 25a of first obliquely polarized light and beams 25b of second obliquely polarized light in a light intensity distribution 25, and there are no beams of vertically polarized light and laterally polarized light. Therefore, the beams 25a of first obliquely polarized light and the beams 25b of second obliquely polarized light are subjected to the phase modulation by the phase modulating member 5B to turn into elliptically polarized light beams, and thereafter the elliptically polarized light beams are affected by the retardation by the subsequent optical system to return into substantially required, first obliquely polarized light and second obliquely polarized light.

Figure 14:
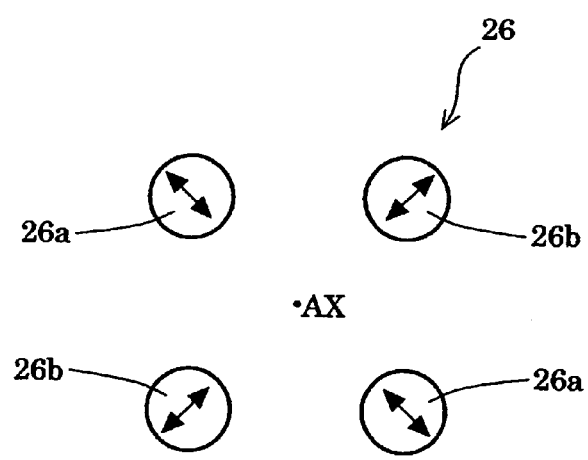
FIG. 14 is an exemplary drawing showing an X-shaped quadrupolar light intensity distribution in a radially polarized state formed on the illumination pupil just behind the polarization converting member.

Similarly, in a case where an X-shaped quadrupolar light intensity distribution 26 is formed in a radially polarized state on the illumination pupil just behind the polarization converting member 5A as shown in FIG. 14, there are only beams 26a of first obliquely polarized light and beams 26b of second obliquely polarized light in a light intensity distribution 26, and there are no beams of vertically polarized light and laterally polarized light. Therefore, the beams 26a of first obliquely polarized light and the beams 26b of second obliquely polarized light are subjected to the phase modulation by the phase modulating member 5B to turn into elliptically polarized beams and thereafter the elliptically polarized beams are affected by the retardation by the subsequent optical system to return into almost required, first obliquely polarized light and second obliquely polarized light.

The above-described embodiment explained the embodiment of the present invention on the basis of the polarization converting member 5A having the specific configuration shown in FIG. 3. However, without having to be limited to this, the configuration of the polarization converting member can be modified in various forms. Specifically, a variety of forms can be contemplated as to the arrangement position, material, structure (the contour, the number of division, the surface shape (thickness distribution), and the side where the uneven surface is formed), etc. of the polarization converting member.

For example, in the foregoing embodiment the polarization converting member 5A is arranged at or near the pupil position of the afocal lens 4. However, without having to be limited to this, the polarization converting member 5A can be arranged at the position of the other illumination pupil or a position near it in the illumination optical system (1-12). Specifically, the polarization converting member 5A can also be arranged near the entrance plane of the micro fly's eye lens 8, near the exit plane of the micro fly's eye lens 8, at or near the pupil position of the imaging optical system 12, and so on.

In the above-described embodiment, the polarization converting member 5A has the contour of circular shape in whole and is divided into the eight arcuate regions 51a-51h. However, without having to be limited to this, a variety of forms can be contemplated as to the overall contour, the number of division, etc. of the polarization converting member.

In the above-described embodiment, the polarization converting member 5A is made of rock crystal. However, the material does not always have to be limited to rock crystal, but the polarization converting member may also be made of another appropriate optical material having an optical rotatory power. Furthermore, the member does not always have to be limited to the optically rotatory member, but the polarization converting member can also be configured using a plurality of wave plates that change incident light into light in a predetermined polarization state.

In the aforementioned embodiment, the phase modulating member 5B is composed of the wave plate having the uniform thickness, and is arranged at the position just behind the polarization converting member 5A, i.e., at the illumination pupil or at the position near it. However, without having to be limited to this, a variety of forms can be contemplated as to the specific configuration, the arrangement position, etc. of the phase modulating member. For example, the phase modulating member 5B can be arranged at an appropriate position in the optical path behind the polarization converting member 5A (on the mask M side thereof), i.e., at an appropriate position in the optical path downstream the illumination pupil. However, when the phase modulating member 5B is arranged at the illumination pupil or at the position near it, it becomes feasible to make uniform phase modulation act on the illumination pupil plane.

In general, the phase modulating member functions to transmit light so as to convert obliquely polarized light in the pupil intensity distribution formed on the illumination pupil through the polarization converting member, into required elliptically polarized light and maintain the polarization state of vertically polarized light or laterally polarized light in the pupil intensity distribution. It is important herein that the degree of polarization of light subjected to the phase modulation from obliquely polarized light into elliptically polarized light by the phase modulating member be set so that the elliptically polarized light becomes closer to required obliquely polarized light after affected by the retardation by the subsequent optical system behind the polarization converting member.

In the aforementioned embodiment the phase modulating member 5B is arranged just behind the polarization converting member 5A. In this case, if necessary, the polarization converting member 5A and the phase modulating member 5B can be integrally held and configured so as to be integrally inserted into or retracted from the illumination optical path. The polarization converting member and the phase modulating member may also be configured each so as to be inserted into or retracted from the illumination optical path and so as to be positioned in the illumination optical path as occasion may demand.

In the foregoing embodiment, the micro fly's eye lens 8 is used as an optical integrator, but instead thereof, an optical integrator of an internal reflection type (typically, a rod type integrator) may also be used. In this case, a condensing lens is arranged behind the zoom lens 7 so that its front focal position coincides with the rear focal position of the zoom lens 7, and the rod type integrator is arranged so that an entrance end thereof is positioned at or near the rear focal position of this condensing lens. In this case, an exit end of the rod type integrator is located at the position of the illumination field stop 11. When the rod type integrator is used, a position optically conjugate with the position of the aperture stop of the projection optical system PL in the field stop imaging optical system 12 downstream this rod type integrator can be called an illumination pupil plane. A virtual image of the secondary light source on the illumination pupil plane is formed at the position of the entrance plane of the rod type integrator and, therefore, this position and positions optically conjugate with this position can also be called illumination pupil planes.

The exposure apparatus of the above embodiment is manufactured by assembling various sub-systems including the constituent elements described in the scope of claims in the present application so as to maintain predetermined mechanical accuracy, electrical accuracy, and optical accuracy. In order to ensure these various accuracies, the following adjustments are carried out before and after this assembling: adjustment for achieving the optical accuracy for various optical systems; adjustment for achieving the mechanical accuracy for various mechanical systems; adjustment for achieving the electrical accuracy for various electrical systems. Assembling blocks from the various sub-systems into the exposure apparatus include mechanical connection, wiring connection of electric circuits, pipe connection of pneumatic circuits, etc. between the various sub-systems. It is needless to mention that there are assembling blocks of the individual sub-systems, prior to the assembling blocks from these various sub-systems into the exposure apparatus. After completion of the assembling blocks of the various sub-systems into the exposure apparatus, overall adjustment is carried out so as to ensure the various accuracies as a whole of the exposure apparatus. The manufacture of the exposure apparatus may be carried out in a clean room in which the temperature, cleanliness, etc. are controlled.

Figure 15:
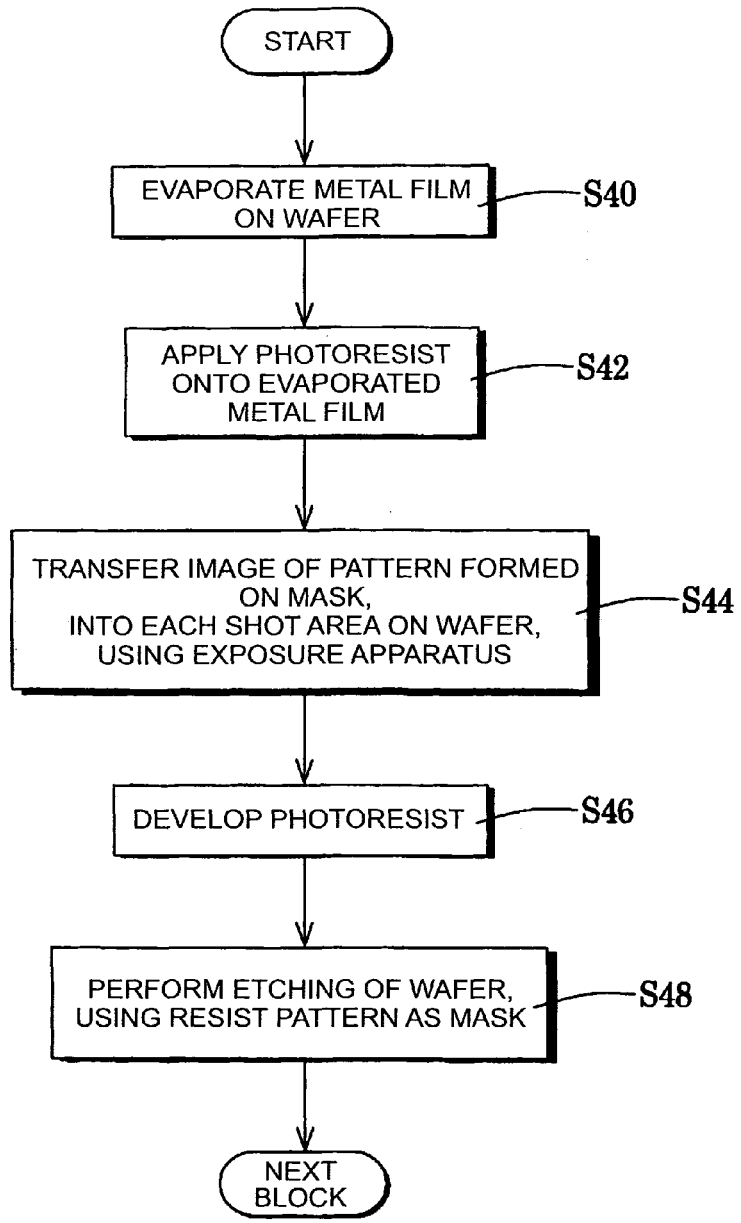
FIG. 15 is an exemplary flowchart showing manufacturing blocks of semiconductor devices.

The below will describe a device manufacturing method using the exposure apparatus of the above embodiment. FIG. 15 is an exemplary flowchart showing manufacturing blocks of semiconductor devices. As shown in FIG. 15, the manufacturing blocks of semiconductor devices include evaporating a metal film on a wafer W as a substrate for semiconductor devices (block S40), and applying a photoresist as a photosensitive material onto the evaporated metal film (block S42). Subsequently, using the exposure apparatus of the above embodiment, a pattern formed on a mask (reticle) M is transferred into each shot area on the wafer W (block S44: exposure block) and the block thereafter is to develop the wafer W after completion of the transfer, i.e., develop the photoresist on which the pattern is transferred (block S46: development block). Thereafter, using the resist pattern formed on the surface of the wafer W in block S46, as a mask, the surface of the wafer W is subjected to processing such as etching (block S48: processing block).

The resist pattern herein is a photoresist layer in which projections and depressions are formed in a shape corresponding to the pattern transferred by the exposure apparatus of the embodiment and through which the depressions penetrate. Block S48 is to process the surface of the wafer W through this resist pattern. The processing carried out in block S48 includes, for example, at least one of etching of the surface of the wafer W and film formation of a metal film or the like. In block S44, the exposure apparatus of the above embodiment performs the transfer of the pattern using the wafer W coated with the photoresist, as a photosensitive substrate or plate P.

Figure 16:
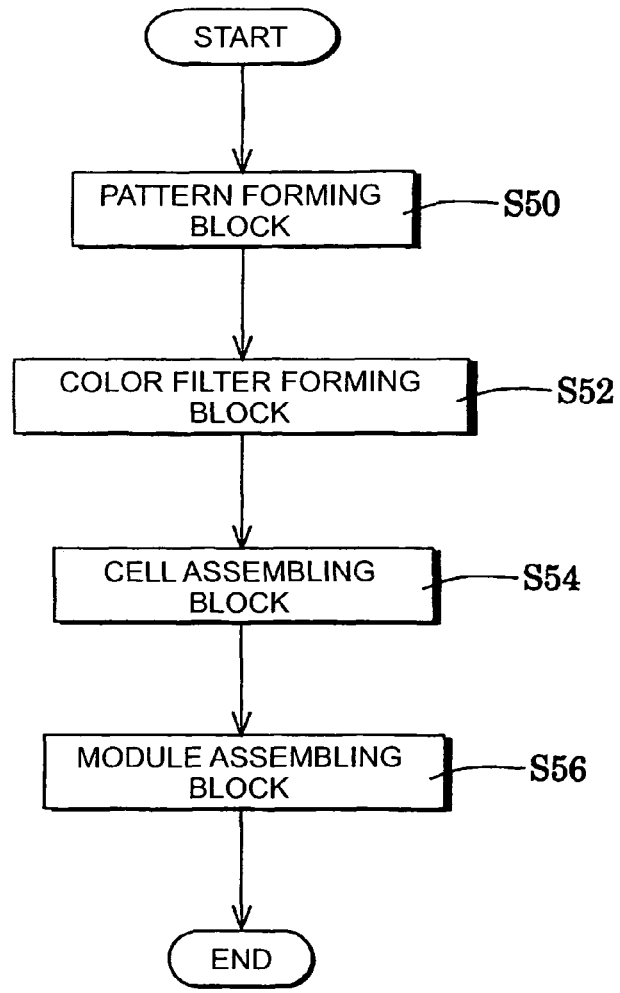
FIG. 16 is an exemplary flowchart showing manufacturing blocks of a liquid crystal device such as a liquid crystal display device.

FIG. 16 is an exemplary flowchart showing manufacturing blocks of a liquid crystal device such as a liquid crystal display device. As shown in FIG. 16, the manufacturing blocks of liquid crystal device are to sequentially carry out a pattern forming block (block S50), a color filter forming block (block S52), a cell assembling block (block S54), and a module assembling block (block S56). In the pattern forming block of block S50, a predetermined pattern such as a circuit pattern and an electrode pattern is formed on a glass substrate coated with a photoresist as a plate P, using the exposure apparatus of the above embodiment. This pattern forming block includes an exposure block of transferring the pattern onto the photoresist layer, using the exposure apparatus of the above embodiment, a development block of developing the plate P on which the pattern is transferred, i.e., developing the photoresist on the glass substrate to generate a photoresist layer in a shape corresponding to the pattern, and a processing block of processing the surface of the glass substrate through the developed photoresist layer.

In the color filter forming block of block S52, a color filter is formed in a structure in which a large number of sets of three dots corresponding to R (Red), G (Green), and B (Blue) are arrayed in a matrix pattern or in a structure in which a plurality of filter sets of three stripes of R, G, and B are arrayed in a horizontal scanning direction. In the cell assembling block of block S54, a liquid crystal panel (liquid crystal cell) is assembled using the glass substrate with the predetermined pattern formed in block S50, and the color filter formed in block S52. Specifically, for example, a liquid crystal is poured into between the glass substrate and the color filter to form the liquid crystal panel. In the module assembling block of block S56, various components such as an electric circuit and backlights for display operation of this liquid crystal panel are attached to the liquid crystal panel assembled in block S54.

The present embodiment is not limited to the application to the exposure apparatus for manufacture of semiconductor devices, but can also be widely applied to exposure apparatus for display devices such as liquid crystal display devices or plasma displays formed with rectangular glass plates, and to exposure apparatus for manufacture of various devices such as imaging devices (CCD and others), micromachines, thin film magnetic heads, and DNA chips. Furthermore, the present embodiment can also be applied to an exposure block (exposure apparatus) in manufacturing masks (photomasks, reticles, etc.) on which mask patterns for various devices are formed, by the photolithography process.

The above embodiment used the ArF excimer laser light (wavelength: 193 nm) or the KrF excimer laser light (wavelength: 248 nm) as the exposure light, but, without having to be limited to this, it is also possible to apply the present embodiment to other appropriate laser light sources, e.g., an $F_2$ laser light source to supply laser light at the wavelength of 157 nm.

The projection optical system in the above embodiment does not always have to be limited to the reduction system but may be either of an equal magnification system or an enlargement system; the projection optical system does not have to be limited to the dioptric system only, but may be any of catoptric and catadioptric systems; the projection image thereof may be either of an inverted image and an erect image.

In the foregoing embodiment, it is also possible to apply a technique of filling the interior space of the optical path between the projection optical system and the photosensitive substrate with a medium having the refractive index of more than 1.1 (typically, a liquid), the so-called liquid immersion method. In this case, the technique of filling the interior space of the optical path between the projection optical system and the photosensitive substrate with the liquid can be one selected from the technique of locally filling the space with the liquid as disclosed in International Publication WO99/49504, the technique of moving a stage holding a substrate as an object to be exposed, in a liquid bath as disclosed in Japanese Patent Application Laid-Open No. H6-124873, the technique of forming a liquid bath in a predetermined depth on a stage and holding the substrate therein as disclosed in Japanese Patent Application Laid-Open No. H10-303114, and so on. The teachings of International Publication WO99/49504, Japanese Patent Application Laid-Open No. H6-124873, and Japanese Patent Application Laid-Open No. H10-303114 above are incorporated herein by reference.

In the foregoing embodiment, instead of the diffraction optical element 3 or in addition to the diffraction optical element 3, it is also possible to use, for example, a spatial light modulating element which is composed of a large number of microscopic element mirrors arranged in an array form and individually driven and controlled in their angle and direction of inclination and which divides an incident beam into microscopic units of respective reflecting faces so as to deflect divided beams, thereby converting the cross section of the beam into a desired shape or a desired size. The illumination optical system using such a spatial light modulating element is disclosed, for example, in Japanese Patent Application Laid-Open No. 2002-353105.

When such a spatial light modulator is used, the polarization converting member configured to convert the polarization state of incident light to form the pupil intensity distribution in the predetermined polarization state on the illumination pupil of the illumination optical system may be arranged so that it can be located in the illumination optical path on the light source side of the spatial light modulator.

In the above embodiment, a variable pattern forming device to form a predetermined pattern on the basis of predetermined electronic data can be used instead of the mask. The variable pattern forming device applicable herein can be, for example, a spatial light modulating element including a plurality of reflecting elements driven based on the predetermined electronic data. The exposure apparatus using the spatial light modulating element is disclosed, for example, in Japanese Patent Application Laid-Open No. 2004-304135 and U.S. Patent Application Laid-Open No. 2007/0296936. Besides the reflection type spatial light modulators of the non-emission type as described above, it is also possible to use a transmission type spatial light modulator or a self-emission type image display device.

The above embodiment was the embodiment of the present invention applied to the illumination optical system for illuminating the mask (or the wafer) in the exposure apparatus, but, without having to be limited to this, it is also possible to apply the present embodiment to the general illumination optical systems for illuminating the illumination target surface except for the mask (or the wafer).

It will be understood by those skilled in the art that aspects of embodiments of the subject matter disclosed above are intended to satisfy the requirement of disclosing at least one enabling embodiment of the subject matter of each claim and to be one or more such exemplary embodiments only and to not to limit the scope of any of the claims in any way and particularly not to a specific disclosed embodiment alone. Many changes and modification can be made to the disclosed aspects of embodiments of the disclosed subject matter of the claims that will be understood and appreciated by those skilled in the art, particularly in regard to interpretation of the claims for purposes of the doctrine of equivalents. The appended claims are intended in scope and meaning to cover not only the disclosed aspects of embodiments of the claimed subject matter but also such equivalents and other modifications and changes that would be apparent to those skilled in the art. In additions to changes and modifications to the disclosed and claimed aspects of the subject matter disclosed of the disclosed subject matter(s) noted above, others could be implemented.

While the particular aspects of embodiment(s) of the {TITLE} described and illustrated in this patent application in the detail required to satisfy 35 U.S.C. §112 is fully capable of attaining any above-described purposes for, problems to be solved by or any other reasons for or objects of the aspects of an embodiment(s) above described, it is to be understood by those skilled in the art that it is the presently described aspects of the described embodiment(s) of the subject matter claimed are merely exemplary, illustrative and representative of the subject matter which is broadly contemplated by the claimed subject matter. The scope of the presently described and claimed aspects of embodiments fully encompasses other embodiments which may now be or may become obvious to those skilled in the art based on the teachings of the Specification. The scope of the present {TITLE} is solely and completely limited by only the appended claims and nothing beyond the recitations of the appended claims. Reference to an element in such claims in the singular is not intended to mean nor shall it mean in interpreting such claim element "one and only one" unless explicitly so stated, but rather "one or more". All structural and functional equivalents to any of the elements of the above-described aspects of an embodiment(s) that are known or later come to be known to those of ordinary skill in the art are expressly incorporated herein by reference and are intended to be encompassed by the present claims. Any term used in the Specification and/or in the claims and expressly given a meaning in the Specification and/or claims in the present application shall have that meaning, regardless of any dictionary or other commonly used meaning for such a term. It is not intended or necessary for a device or method discussed in the Specification as any aspect of an embodiment to address each and every problem sought to be solved by the aspects of embodiments disclosed in this application, for it to be encompassed by the present claims. No element, component, or method step in the present disclosure is intended to be dedicated to the public regardless of whether the element, component, or method step is explicitly recited in the claims. No claim element in the appended claims is to be construed under the provisions of 35 U.S.C. §112, sixth paragraph, unless the element is expressly recited using the phrase "means for" or, in the case of a method claim, the element is recited as a "step" instead of an "act."

It will be understood also be those skilled in the art that, in fulfillment of the patent statutes of the United States, Applicant(s) has disclosed at least one enabling and working embodiment of each invention recited in any respective claim appended to the Specification in the present application and perhaps in some cases only one. For purposes of cutting down on patent application length and drafting time and making the present patent application more readable to the inventor(s) and others, Applicant(s) has used from time to time or throughout the present application definitive verbs (e.g., "is", "are", "does", "has", "includes" or the like) and/or other definitive verbs (e.g., "produces," "causes" "samples," "reads," "signals" or the like) and/or gerunds (e.g., "producing," "using," "taking," "keeping," "making," "determining," "measuring," "calculating" or the like), in defining an aspect/feature/element of, an action of or functionality of, and/or describing any other definition of an aspect/feature/element of an embodiment of the subject matter being disclosed. Wherever any such definitive word or phrase or the like is used to describe an aspect/feature/element of any of the one or more embodiments disclosed herein, i.e., any feature, element, system, sub-system, component, sub-component, process or algorithm step, particular material, or the like, it should be read, for purposes of interpreting the scope of the subject matter of what applicant(s) has invented, and claimed, to be preceded by one or more, or all, of the following limiting phrases, "by way of example," "for example," "as an example," "illustratively only," "by way of illustration only," etc., and/or to include any one or more, or all, of the phrases "may be," "can be", "might be," "could be" and the like. All such features, elements, steps, materials and the like should be considered to be described only as a possible aspect of the one or more disclosed embodiments and not as the sole possible implementation of any one or more aspects/features/elements of any embodiments and/or the sole possible embodiment of the subject matter of what is claimed, even if, in fulfillment of the requirements of the patent statutes, Applicant(s) has disclosed only a single enabling example of any such aspect/feature/element of an embodiment or of any embodiment of the subject matter of what is claimed. Unless expressly and specifically so stated in the present application or the prosecution of this application, that Applicant(s) believes that a particular aspect/feature/element of any disclosed embodiment or any particular disclosed embodiment of the subject matter of what is claimed, amounts to the one an only way to implement the subject matter of what is claimed or any aspect/feature/element recited in any such claim, Applicant(s) does not intend that any description of any disclosed aspect/feature/element of any disclosed embodiment of the subject matter of what is claimed in the present patent application or the entire embodiment shall be interpreted to be such one and only way to implement the subject matter of what is claimed or any aspect/feature/element thereof, and to thus limit any claim which is broad enough to cover any such disclosed implementation along with other possible implementations of the subject matter of what is claimed, to such disclosed aspect/feature/element of such disclosed embodiment or such disclosed embodiment. Applicant(s) specifically, expressly and unequivocally intends that any claim that has depending from it a dependent claim with any further detail of any aspect/feature/element, step, or the like of the subject matter of what is claimed recited in the parent claim or claims from which it directly or indirectly depends, shall be interpreted to mean that the recitation in the parent claim(s) was broad enough to cover the further detail in the dependent claim along with other implementations and that the further detail was not the only way to implement the aspect/feature/element claimed in any such parent claim(s), and thus be limited to the further detail of any such aspect/feature/element recited in any such dependent claim to in any way limit the scope of the broader aspect/feature/element of any such parent claim, including by incorporating the further detail of the dependent claim into the parent claim.

The invention claimed is:

1. An illumination optical system for distributing light from a light source on an illumination pupil and illuminating an illumination target surface with light having passed through the illumination pupil, comprising:
    a reflecting surface which reflects the light from the light source, the reflecting surface causing a phase difference between p-polarized light and s-polarized light, polarization directions of the p-polarized light and s-polarized light being defined to the reflecting surface;
    a polarization converting member which is positioned optically upstream of the reflecting surface and converts a polarization state of the light from the light source so that polarization states at different positions on the illumination pupil are different from each other, at least one of the polarization states at the different positions including a polarization direction different from the p-polarized light and the s-polarized light on the reflecting surface; and
    a phase modulating member which is arranged in an optical path between the polarization converting member and the reflecting surface, the phase modulating member changing a phase difference between first linearly-polarized light and second linearly-polarized light, to reduce the phase difference between the p-polarized light and the s-polarized light caused by the reflecting surface, the first linearly-polarized light passing through the phase modulating member and having a polarization direction corresponding to the p-polarized light, the second linearly-polarized light passing through the phase modulating member and having a polarization direction corresponding to the s-polarized light.

2. The illumination optical system according to claim 1, wherein the phase modulating member has a wave plate an optic axis of which is set in the polarization direction of the p-polarized light or the polarization direction of the s-polarized light.

3. The illumination optical system according to claim 2, wherein the reflecting surface has a first and second planar reflection surfaces, and
    wherein the p-polarized light and the s-polarized light relative to the first planar reflection surface correspond to the polarization direction of the p-polarized light and the polarization direction of the s-polarized light relative to the reflecting surface, and
    the p-polarized light and the s-polarized light relative to the second planar reflection surface correspond to the polarization direction to the p-polarized light and the polarization direction of the s-polarized light relative to the reflecting surface.

4. The illumination optical system according to claim 2, wherein the wave plate extends across an entire cross section of an illumination optical path and has uniform thickness.

5. The illumination optical system according to claim 1, wherein the phase modulating member is arranged at or near the illumination pupil.

6. The illumination optical system according to claim 1, wherein the phase modulating member is held integrally with the polarization converting member.

7. The illumination optical system according to claim 1, wherein the phase modulating member can be inserted into or retracted from an illumination optical path.

8. The illumination optical system according to claim 1, wherein the phase modulating member is arranged on the illumination target surface side with respect to the illumination pupil.

9. The illumination optical system according to claim 1, wherein the illumination optical system is used in combination with a projection optical system for forming a plane optically conjugate with the illumination target surface, and
    wherein the illumination pupil is located at a position optically conjugate with an aperture stop of the projection optical system.

10. The illumination optical system according to claim 1, wherein the reflecting surface is a planar reflecting surface, and
    wherein the phase modulating member converts linearly-polarized light polarized in a direction to required elliptically-polarized light, the direction obliquely intersecting with the polarization direction of the p-polarized light and the polarization direction of the s-polarized light relative to the planar reflecting surface.

11. The illumination optical system according to claim 10, wherein the phase modulating member has a wave plate an optic axis of which is set in the polarization direction of the p-polarized light or in the polarization direction of the s-polarized light.

12. The illumination optical system according to claim 11, wherein the wave plate extends across an entire cross section of an illumination optical path and has uniform thickness.

13. The illumination optical system according to claim 10, wherein the phase modulating member is arranged at or near the illumination pupil.

14. The illumination optical system according to claim 10, wherein the phase modulating member is held integrally with the polarization converting member.

15. The illumination optical system according to claim 10, wherein the phase modulating member can be inserted into or retracted from an illumination optical path.

16. The illumination optical system according to claim 10, wherein the phase modulating member is arranged on the illumination target surface side with respect to the illumination pupil.

17. The illumination optical system according to claim 10, wherein the illumination optical system is used in combination with a projection optical system for forming a plane optically conjugate with the illumination target surface, and
wherein the illumination pupil is located at a position optically conjugate with an aperture stop of the projection optical system.

18. The illumination optical system according to claim 1, wherein the reflecting surface reflects linearly-polarized light polarized in the polarization direction of the p-polarized light and reflects linearly-polarized light polarized in the polarization direction of the s-polarized light, while maintaining polarization states thereof.

19. The illumination optical system according to claim 1, further comprising a diffraction optical element which diffracts incident light at a predetermined angle,
wherein the polarization converting member is arranged between the diffraction optical element and the phase modulating member.

20. The illumination optical system according to claim 1, further comprising a spatial light modulator comprising a plurality of mirror elements whose orientations can be varied, the plurality of mirror elements being arranged two-dimensionally.

21. The illumination optical system according to claim 20, wherein the polarization converting member is arranged in an optical path at the light source side of the spatial light modulator.

22. The illumination optical system according to claim 1, wherein the polarization converting member is arranged at a position of the illumination pupil of the illumination optical system or arranged at a position equivalent of the position of the illumination pupil.

23. The illumination optical system according to claim 1, further comprising a fly's eye optical system having a plurality of optical surfaces, the plurality of optical surfaces being arranged at a position of the illumination pupil of the illumination optical system or arranged on a surface which crosses an optical path of the illumination optical system at a position equivalent of the position of the illumination pupil.

24. An illumination method for distributing light from a light source on an illumination pupil and illuminating an illumination target surface with light having passed through the illumination pupil, comprising:
reflecting the light from the light source by using a reflecting surface;
causing a phase difference between p-polarized light and s-polarized light, polarization directions of the p-polarized light and the s-polarized light being defined to the reflecting surface;
converting a polarization state of the light from the light source, by using a polarization converting member positioned optically upstream of the reflecting surface, so that polarization states at different positions on the illumination pupil are different from each other, at least one of the polarization states at the different position including a polarization direction different from the p-polarized light and the s-polarized light on the reflecting surface;
changing a phase difference between first linearly-polarized light and second linearly-polarized light, by using a phase modulating member, arranged in an optical path between the polarization converting member and the reflecting surface, to reduce the phase difference between the p-polarized light and the s-polarized light caused by the reflecting surface, the first linearly-polarized light passing through the phase modulating member and having a polarization direction corresponding to the p-polarized light, the second linearly-polarized light passing through the phase modulating member and having a polarization direction corresponding to the s-polarized light; and
illuminating the reflecting surface with the first linearly-polarized light and the second linearly-polarized light in which the phase difference therebetween is changed.

25. The illumination method according to claim 24, wherein the changing of the phase difference between the first linearly-polarized light and the second linearly-polarized light includes:
using a wave plate an optic axis of which is set in the polarization direction of the p-polarized light or the polarization direction of the s-polarized light.

26. The illumination method according to claim 25, wherein the reflecting includes:
reflecting the light by a first reflection surface and a second planar reflection surface,
wherein the p-polarized light and the s-polarized light relative to the first planar reflection surface correspond to the polarization direction of the p-polarized light and the polarization direction of the s-polarized light relative to the reflecting surface, and
the p-polarized light and the s-polarized light relative to the second planar reflection surface correspond to the polarization direction of the polarized light and the polarization direction of the s-polarized light relative to the reflecting surface.

27. The illumination method according to claim 25, wherein the wave plate extends across an entire cross section of an illumination optical path and has uniform thickness.

28. The illumination method according to claim 24, wherein the reflecting reflects the light by a planar reflecting surface, and
wherein the changing of the phase difference between the first linearly-polarized light and the second linearly-polarized light converts linearly-polarized light polarized in a direction to required elliptically-polarized light, the direction obliquely intersecting with the polarization direction of the p-polarized light and the polarization direction of the s-polarized light relative to the planar reflecting surface.

29. The illumination method according to claim 24, wherein the changing of the difference between the first linearly-polarized light and the second-linearly polarized light includes:
using a wave plate an optic axis of which is set in the polarization direction of the p-polarized light or in the polarization direction of the s-polarized light.

30. The illumination method according to claim 29, wherein the wave plate extends across an entire cross section of an illumination optical path and has uniform thickness.

31. The illumination method according to claim 24, wherein the reflecting surface reflects linearly-polarized light polarized in the polarization direction of the p-polarized light and reflects linearly-polarized light polarized in the polarization direction of the s-polarized light, while maintaining polarization states thereof.

32. The illumination method according to claim 24, further comprising:

reflecting the light by a spatial light modulator comprising a plurality of mirror elements whose orientations can be varied, the plurality of mirror elements being arranged two-dimensionally.

* * * * *